(12) United States Patent
Lane et al.

(10) Patent No.: US 6,784,501 B2
(45) Date of Patent: Aug. 31, 2004

(54) PROCESS FOR FORMING METALIZED CONTACTS TO PERIPHERY TRANSISTORS

(75) Inventors: Richard H. Lane, Boise, ID (US); Terry McDaniel, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/400,492

(22) Filed: Mar. 28, 2003

(65) Prior Publication Data

US 2003/0183822 A1 Oct. 2, 2003

Related U.S. Application Data

(62) Division of application No. 09/986,167, filed on Nov. 7, 2001.

(51) Int. Cl.[7] .............................................. H01L 29/76
(52) U.S. Cl. ...................... 257/382; 257/306; 257/369; 257/773
(58) Field of Search ................................ 257/382, 306, 257/369, 773

(56) References Cited

U.S. PATENT DOCUMENTS

| | | | |
|---|---|---|---|
| 5,689,126 A | 11/1997 | Takaishi | |
| 5,858,831 A | 1/1999 | Sung | |
| 5,893,734 A | 4/1999 | Jeng et al. | |
| 6,008,084 A | 12/1999 | Sung | |
| 6,200,855 B1 | 3/2001 | Lee | |
| 6,294,426 B1 | 9/2001 | Tu et al. | |
| 6,436,763 B1 | 8/2002 | Huang et al. | |
| 6,534,809 B2 | 3/2003 | Moise et al. | |
| 6,541,333 B2 | 4/2003 | Shukuri et al. | |
| 2003/0183822 A1 * | 10/2003 | Lane et al. | ............. 257/68 |

FOREIGN PATENT DOCUMENTS

FR    2 800 199    4/2001

OTHER PUBLICATIONS

International Search Report dated Jun. 11, 2003.

* cited by examiner

Primary Examiner—Mark V. Prenty
(74) Attorney, Agent, or Firm—Dickstein Shapiro Morin & Oshinsky LLP

(57) ABSTRACT

A process and apparatus directed to forming metal plugs in a peripheral logic circuitry area of a semiconductor device to contact both N+ and P+ doped regions of transistors in the peripheral logic circuitry area. The metal plugs are formed after all high temperature processing used in wafer fabrication is completed. The metal plugs are formed without metal diffusing into the active areas of the substrate. The metal plugs may form an oval slot as seen from a top down view of the semiconductor device.

21 Claims, 16 Drawing Sheets

PROCESS FOR FORMING METALIZED CONTACTS TO PERIPHERY TRANSISTORS

This application is a divisional of U.S. patent application, Ser. No. 09/986,167, filed Nov. 7, 2001, the subject matter of which is incorporated by reference herein.

FIELD OF THE INVENTION

The present invention relates to the field of integrated circuits and, in particular, the use of a metal plug structure for contacting doped regions in a periphery transistor of a memory device.

BACKGROUND OF THE INVENTION

Complex integrated circuits, such as dynamic random access memories (DRAM), have multiple levels of conductors above the surface of a silicon substrate that are used to interconnect various portions of a fabricated circuit.

For DRAM memory devices, the doped regions or active area of a transistor fabricated in a substrate are typically contacted using polysilicon (poly) plugs, which may connect with a capacitor, a bit line, or other conductor layers. Metal plugs would provide better conductivity than poly plugs; however, metal plugs are typically not used to contact the doped regions of a substrate because of processing restraints including the heat sensitivity of a metal plug to later high temperature fabrication processes and possible active area contamination caused by metal diffusing into the active area of the substrate. For instance, in DRAM memory devices, heat cycles are often used to anneal capacitor structures formed after formulation of the substrate contact plugs, which would melt a metal plug and cause the metal to diffuse into the substrate and thereby contaminate the active area and ruin conductivity between the plug and the substrate. Nevertheless, because of its better conductive properties, it would be preferable if at least some of the conductive plugs to the substrate surface were made of metal instead of polysilicon, particularly for peripheral logic transistors where higher speed operations typically occur.

BRIEF SUMMARY OF THE INVENTION

The present invention provides a method and apparatus, which provides an integrated circuit, for example, a DRAM memory device, which utilizes a metal plug structure for contacting doped regions of transistors in the peripheral logic area of the circuitry. The metal plug structure is formed after all high temperature processing steps utilized in wafer fabrication are completed. In particular the invention provides a method for forming metallized contacts to N-channel and P-channel periphery circuit transistor in a memory device by forming the metal plug after a heat cycle process used for capacitor formation and cell poly activation. The metal plugs may be formed prior to forming upper cell plate contacts to the capacitor of a memory device, but subsequent to high temperature processing treatment for the capacitor.

BRIEF DESCRIPTION OF THE DRAWINGS

These and other features and advantages of the invention will be better understood from the following detailed description, which is provided in connection with the accompanying drawings.

DETAILED DESCRIPTION OF THE MENTION

Figure 1:
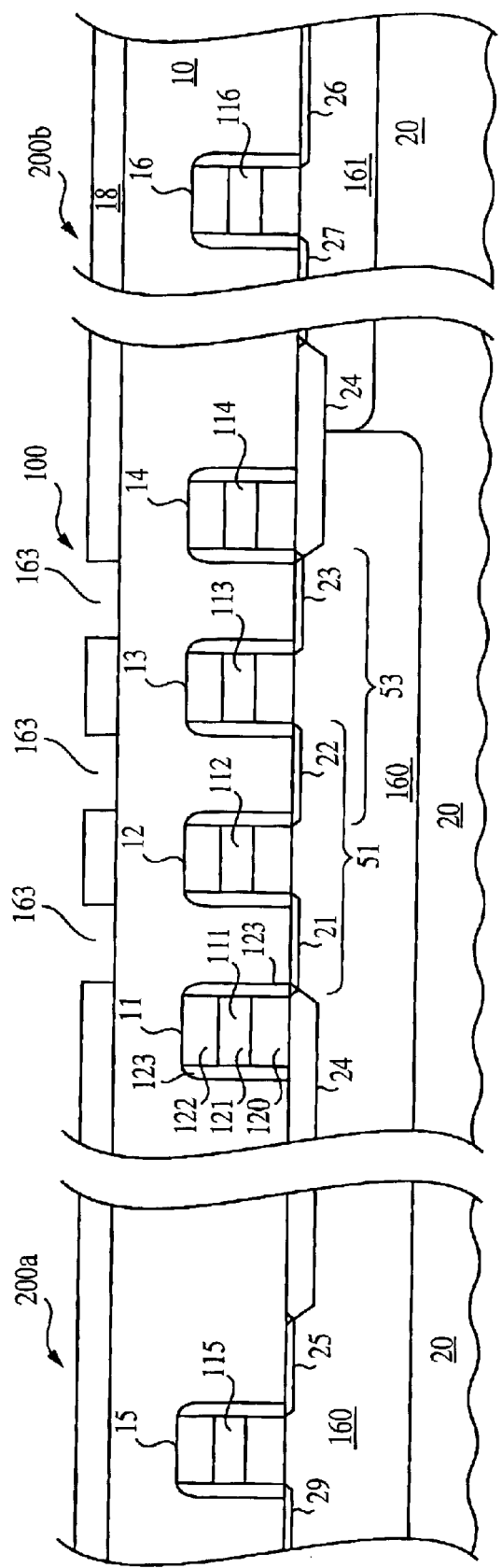
FIG. 1 is a cross-sectional view of the early stages of fabrication of a semiconductor device in accordance with an exemplary embodiment of the present invention.

In the following detailed description, reference is made to various specific embodiments in which the invention may be practiced. These embodiments are described with sufficient detail to enable those skilled in the art to practice the invention, and it is to be understood that other embodiments may be employed, and that various structural, logical, and electrical changes may be made without departing from the spirit or scope of the invention.

The term "substrate" used in the following description may include any semiconductor-based structure that has an exposed substrate surface. Structure should be understood to include silicon-on-insulator (SOI), silicon-on-sapphire (SOS), doped and undoped semiconductors, epitaxial layers of silicon supported by a base semiconductor foundation, and other semiconductor structures. When reference is made to a substrate or wafer in the following description, previous process steps may have been utilized to form regions or junctions in or over the base semiconductor or foundation.

The present invention relates to forming metallized plugs to a substrate, particularly for transistors formed as part of the peripheral logic of a memory device. The present invention will be described as set forth in an exemplary embodiment illustrated below. Other embodiments may be used and structural or logical changes may be made without departing from the spirit or the scope of the present invention.

In accordance with the present invention, a method is provided for forming metallized plugs for both N and P doped active regions in a peripheral logic circuitry area, which is typically formed outside of and around the memory cell array area. Referring now to the drawings, where like elements are designated by like reference numerals, FIGS. 1 through 16 illustrate exemplary embodiments of the fabrication steps and resulting structures in accordance with the present invention.

Referring to FIG. 1, the memory array (indicated generally by reference numeral 100) and the peripheral logic circuit area 200a, 200b are shown during an early stage of fabrication. The peripheral logic circuit area is typically split between an N-channel transistor area 200a and a P-channel transistor area 200b. As shown in FIG. 1, the N-channel transistors in the memory cell array 100 and peripheral logic area 200a, and the P-channel transistor in the peripheral logic area 200b have been formed. The gate stacks in the memory array 100 comprise electrically isolated word lines 112, 113. The gate stacks 15, 16 are associated with respective N-channel and P-channel peripheral logic transistors. Active areas are provided about the gate stacks 12, 13, 15, 16, such as the doped active areas 21, 22, 23, 26, 27, 25, 29, that form Field Effect Transistors (FETs). The memory array includes the gate stacks 11, 12, 13, 14 while the peripheral areas 200a and 200b have respective gate stacks 15, 16. The gate stacks 12, 13 are part of the access transistors 51, 53 for respective memory cells. Each of the gate stacks includes a layer of oxide 120, such as silicon dioxide in contact with the substrate, a conductive gate layer 121 over the oxide, an insulating cap layer 122, and insulating sidewalls 123. The N-channel transistors are formed in a p-well 160 of the substrate while the P-channel transistors are formed in a substrate n-well 161.

As further shown in FIG. 1, planarized first insulating layer 10, formed of, for example, borophosphosilicate glass (BPSG) or silicon dioxide has been formed over the gate stacks and active areas. The first insulating layer is preferably planarized by chemical mechanical polishing (CMP) or other suitable means. FIG. 1 also shows a pair of gate stacks 11, 14 or for other memory cells in a different cross-sectional plane from that illustrated, which are used for self-aligned fabrication processes, and first field oxide regions 24 for isolating memory cells in the memory array 100.

The structure shown in FIG. 1 is conventional but serves as the starting foundation for the invention. The process of the present invention begins by applying a photoresist mask 18 to the first insulating layer 10. Openings 163 in the mask define etch locations and are positioned over the doped active areas 21, 22, 23.

Figure 2:
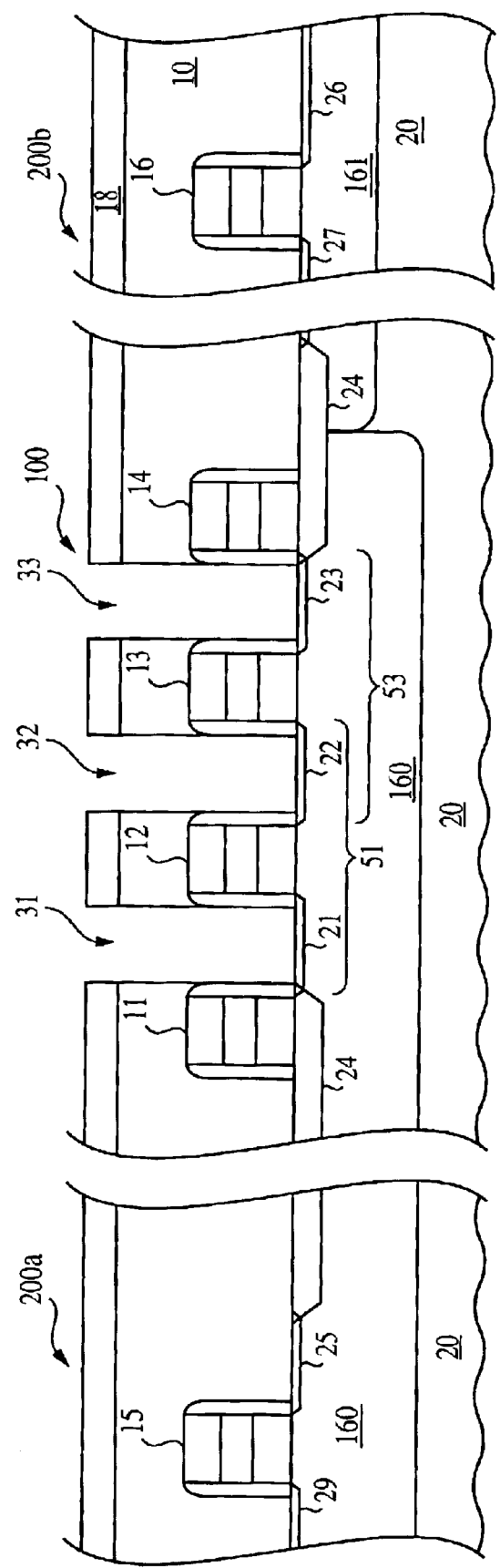
FIG. 2 shows the semiconductor device of FIG. 1 at a processing step subsequent to that shown in FIG. 1.

A first portion of the first insulating layer 10 is next removed by etching to expose the active areas 21, 22, 23 which are N+ doped for the N-channel transistors 51, 53. Plug openings 31, 32, 33 are thus provided, as shown in FIG. 2. It is also possible to dope the areas 21, 22, 23 after the etching operation instead of doping these areas prior to etching.

A directional etching process such as reactive ion etching (RIE) may be used to etch openings 31, 32, 33 (FIG. 2). The etchant conditions are such that only the insulated layer 10 is etched without any or minimal etching of the active areas 21, 22, 23. The peripheral circuitry areas 200a and 200b are not etched at this time.

Figure 3:
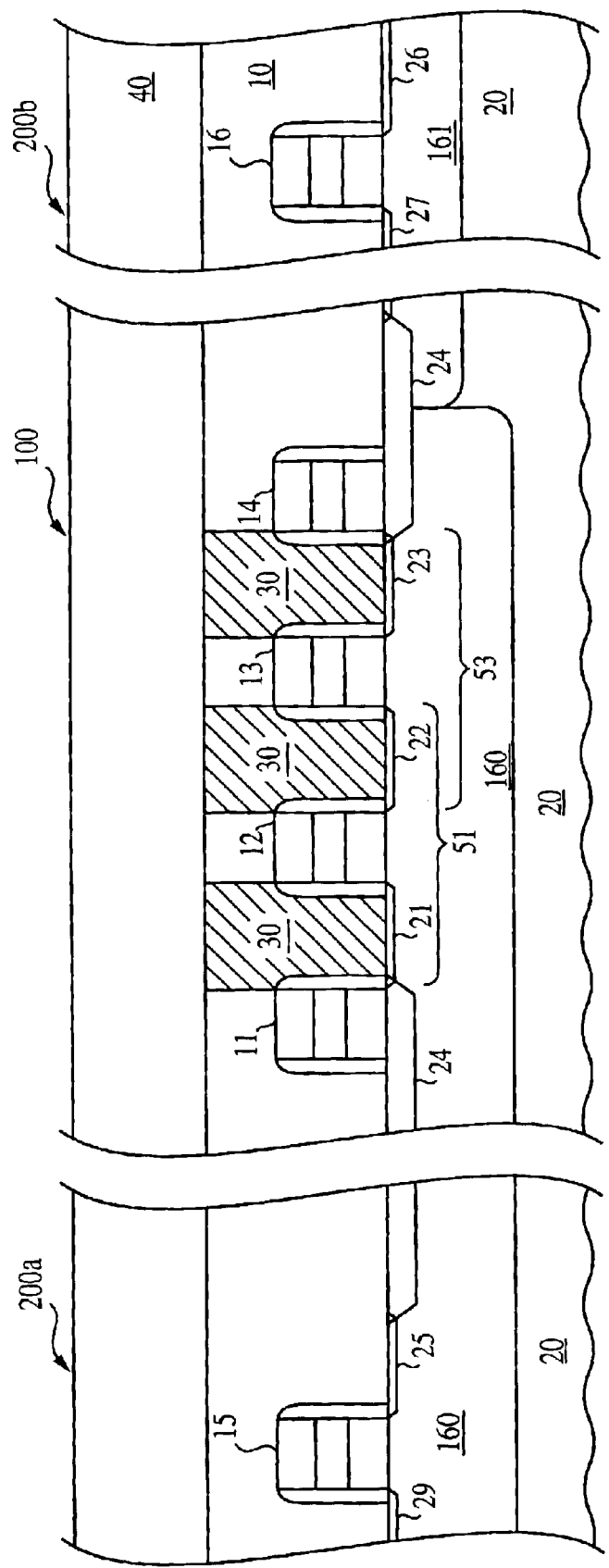
FIG. 3 shows the semiconductor device of FIG. 1 at a processing step subsequent to that shown in FIG. 2.

As shown by the structure illustrated in FIG. 3, after openings 31, 32, 33 are etched, the photoresist 18 is removed and openings 31, 32, 33 are filled with an N+ doped polysilicon plug 30. The resulting structure is then planarized by, for example, CMP. The polysilicon plugs 30 may be doped after or during plug deposition and the plugs may be deposited by CVD or other deposition techniques, as known in the art. A second insulating layer 40 of, for example, BPSG is then deposited over the planarized plugs.

The polysilicon (poly) plugs 30 shown in FIG. 3 can be further identified as poly plugs 41, 43, which will connect with subsequently formed memory cell capacitors and poly plug 42, which will connect with a subsequently formed bit line.

Figure 4:
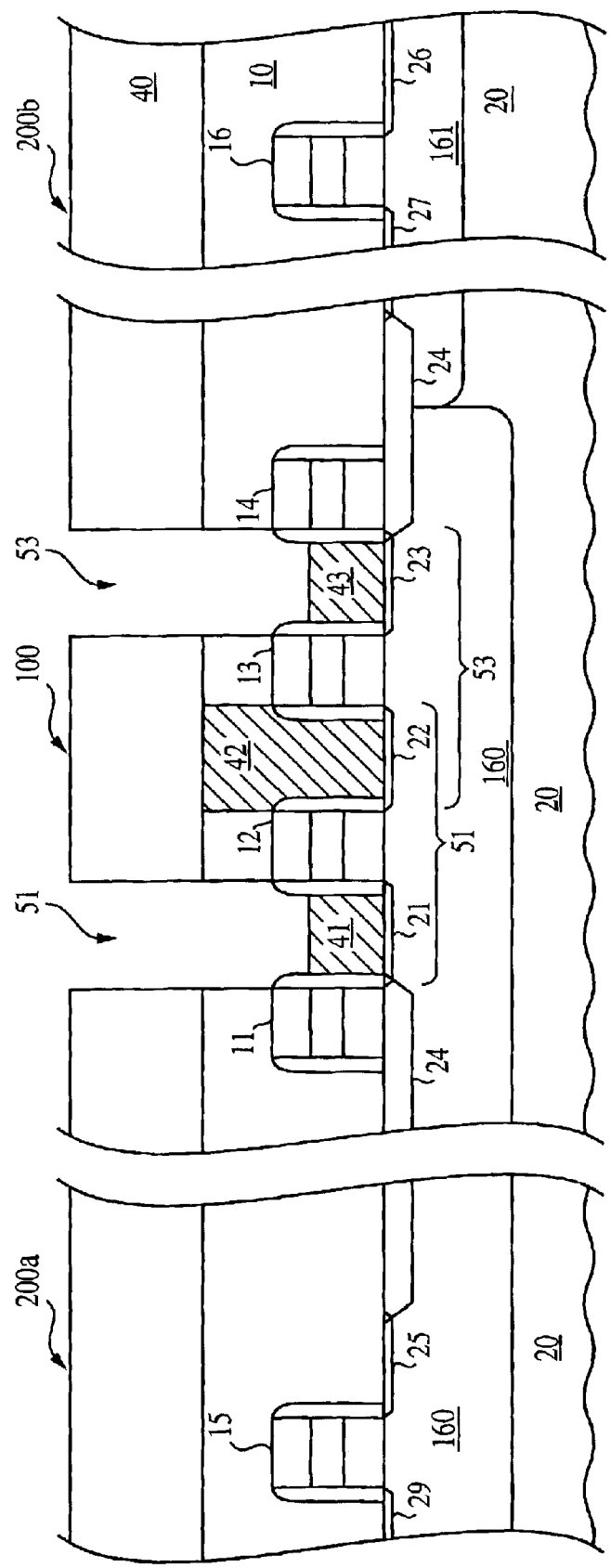
FIG. 4 shows the semiconductor device of FIG. 1 at a processing step subsequent to that shown in FIG. 3.

Referring now to FIG. 4, a directional etching process through a photoresist mask (not shown), such as RIE, is next used to etch through the second BPSG layer 40 and part of the polysilicon plugs 41, 43 to form capacitor container openings 51, 53.

Figure 5:
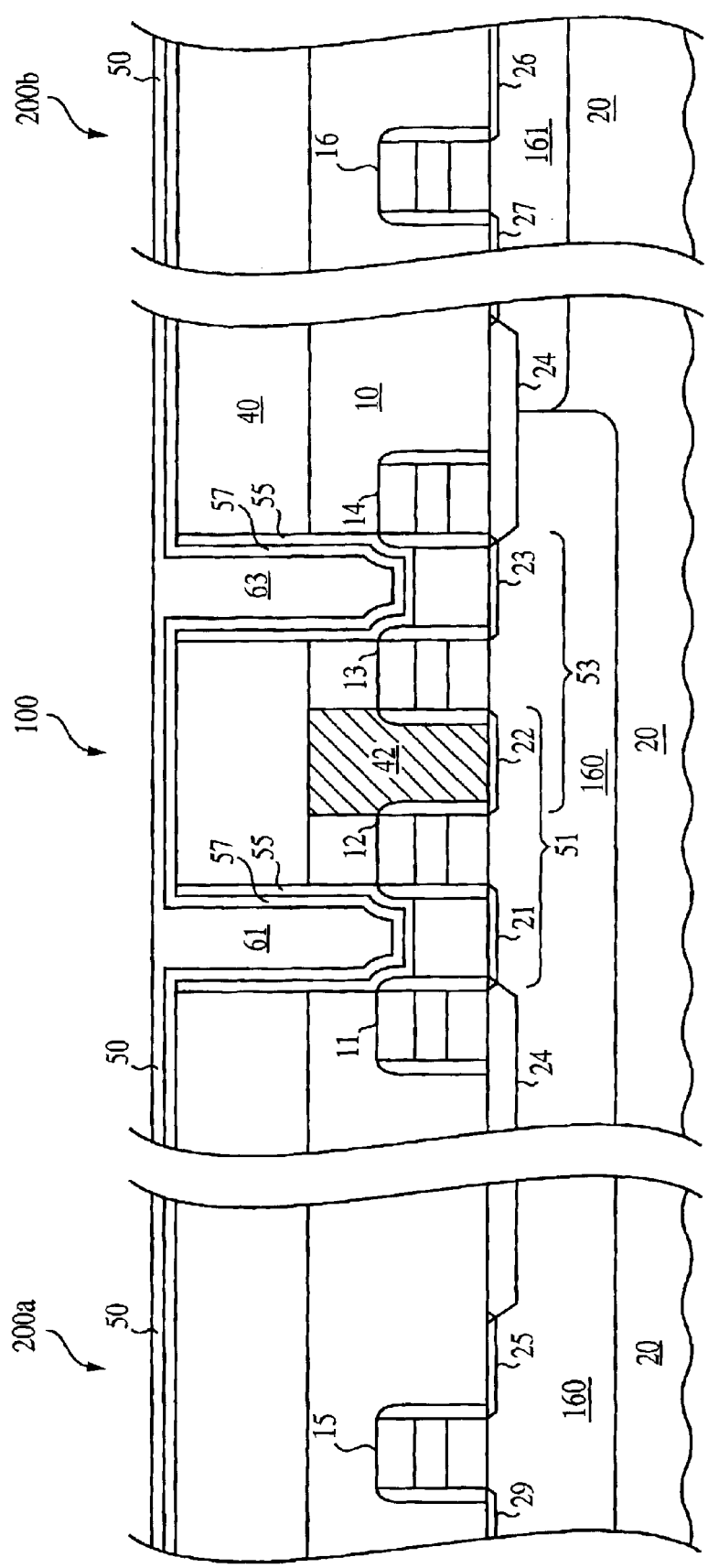
FIG. 5 shows the semiconductor device of FIG. 1 at a processing step subsequent to that shown in FIG. 4.

Referring now to FIG. 5, after the formation of the capacitor container openings 51, 53 a capacitor structure 45 is formed over the semiconductor device 100. Generally the capacitor structure 45 comprises a conductive bottom layer or plate 55, a dielectric layer 57 over the bottom plate, and a conductive upper plate 50. A barrier layer may also be provided between the bottom plate and the poly plugs 41, 43 to prevent migration of the material forming the bottom plate into the poly plugs 41, 43. The bottom plate 55 of each capacitor structure is formed by depositing a conductive layer within openings 51, 53 and then planarizing the upper surface of the structure to remove any conductor layer material on the upper surface of the structure, leaving the bottom conductive layer only in the openings 51, 53. The bottom conductor plate 55 may be a doped polysilicon layer and may further include an HSG layer. The dielectric layer 57 and the upper capacitor plate 50, as shown in FIG. 5, are blanket deposited in sequence. The upper capacitor plate 50 is a common layer for all capacitors of a memory array. The bottom conductive plate 55, however, is deposited and patterned by planarization to produce individual capacitors 61, 63 over the poly plugs 41, 43.

The capacitors must be annealed to be effective, which requires a large amount of thermal energy. For instance, heat processing or heat cycles are typically used to activate or effectively conductively dope the lower cell plate when the lower cell plate is polysilicon. Heat processing may also be used to activate or effectively dope and fix pin holes in the dielectric layer in cases where the upper cell plate is made of polysilicon. Accordingly, heat processing may be applied to only the lower cell plate, or the lower cell plate and dielectric, or to the entire capacitor structure, depending on the materials used to form the capacitor structure. In any event, the invention forms the metallized conductors to the active regions in the substrate after the heat processing is applied.

In accordance with the invention after the capacitors 61, 63 are heat processed, metal plugs are formed to the N-channel and P-channel transistors in the peripheral logic areas 200a, 200b and to the bit line plug 42.

Figure 6:
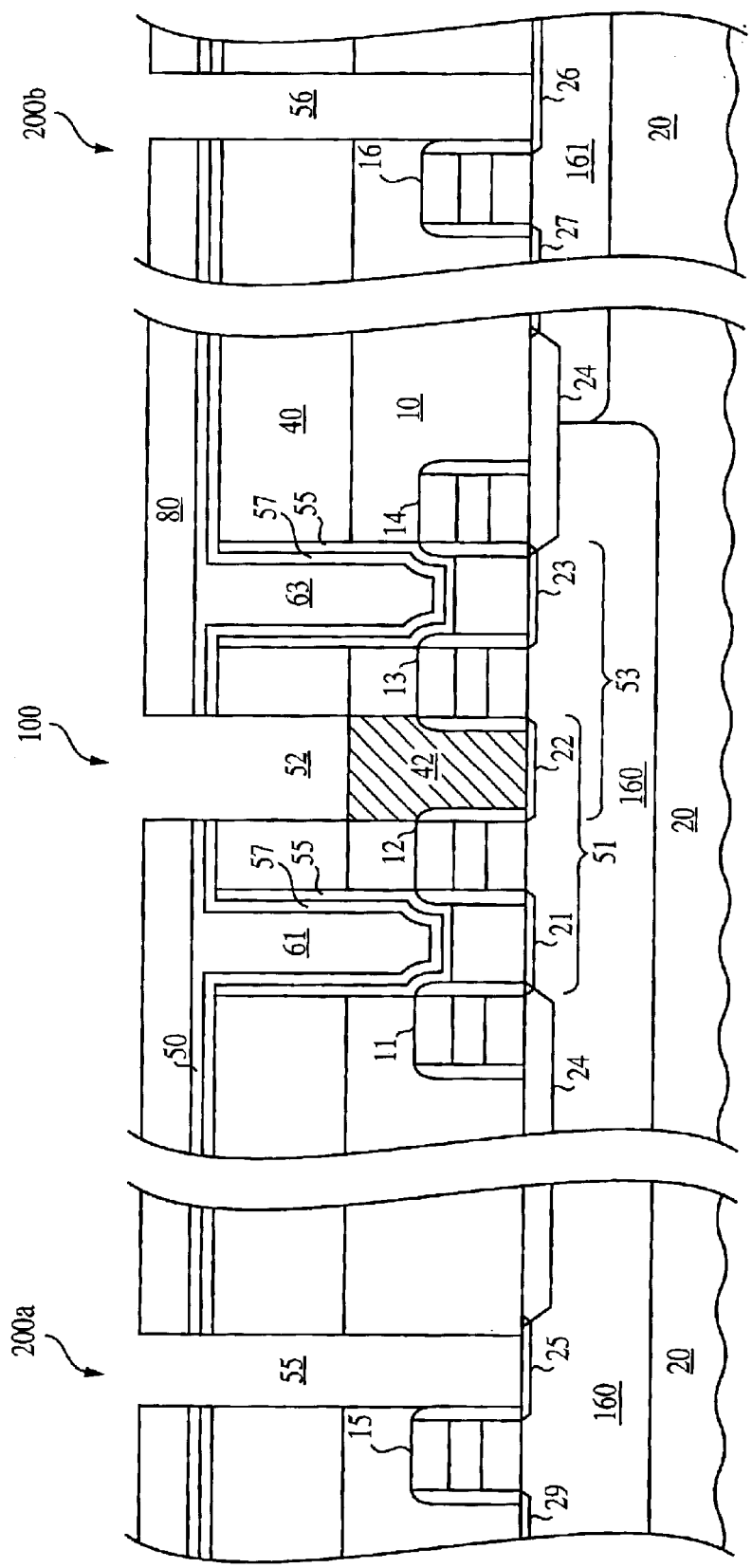
FIG. 6 shows the semiconductor device of FIG. 1 at a processing step subsequent to that shown in FIG. 5.

As shown in FIG. 6, a directional etching process or other suitable process is used to etch through a photoresist mask 80 and the BPSG layer 40 to define bit line opening 52. A directional etching process or other suitable process also occurs in the peripheral circuitry area 200 to etch through the photoresist mask 80 and BPSG layers 10, 40 to define the peripheral plug openings 55, 56 thereby exposing the active areas 25, 26 for the N-channel and P-channel transistors in the peripheral areas 200a, 200b. The photoresist mask layer 80 is removed after the etching process.

Figure 7:
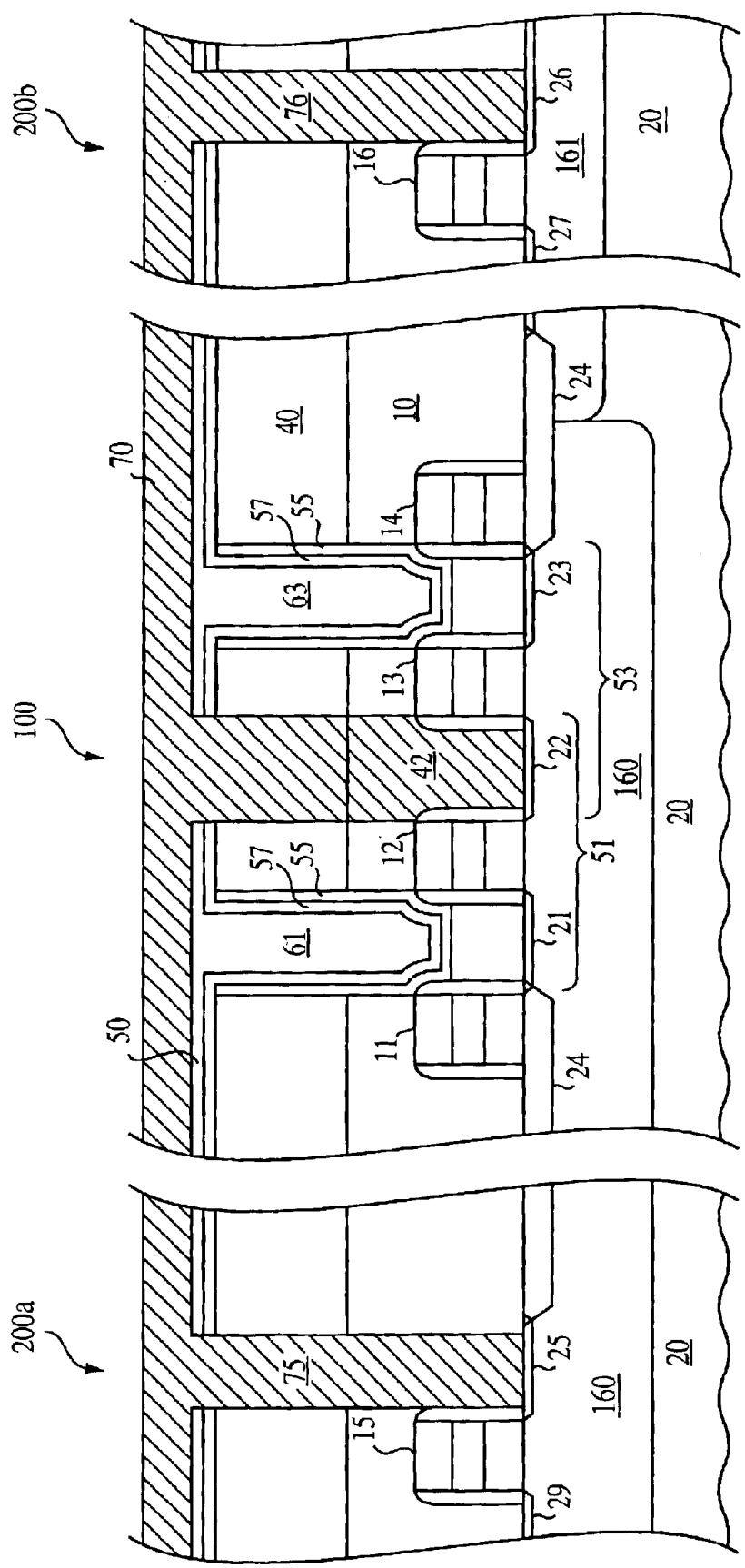
FIG. 7 shows the semiconductor device of FIG. 1 at a processing step subsequent to that shown in FIG. 6.

As shown in FIG. 7, a metal layer 70 is deposited over the memory array 100 and the peripheral circuitry area 200. Accordingly, the metal layer is formed over the exposed outer surfaces of active areas 25, 26, which are P+ doped for the P-channel transistors or N+ doped for N-channel transistors to form metal peripheral plugs 75, 76. The metal layer is further formed over the bit line poly plug 42 to form metal bit line plug 72. Preferably, the metal layer 70 comprises titanium, titanium nitride, tungsten, cobalt, molybdenum or tantalum, but any suitable metal may be used.

Figure 8:
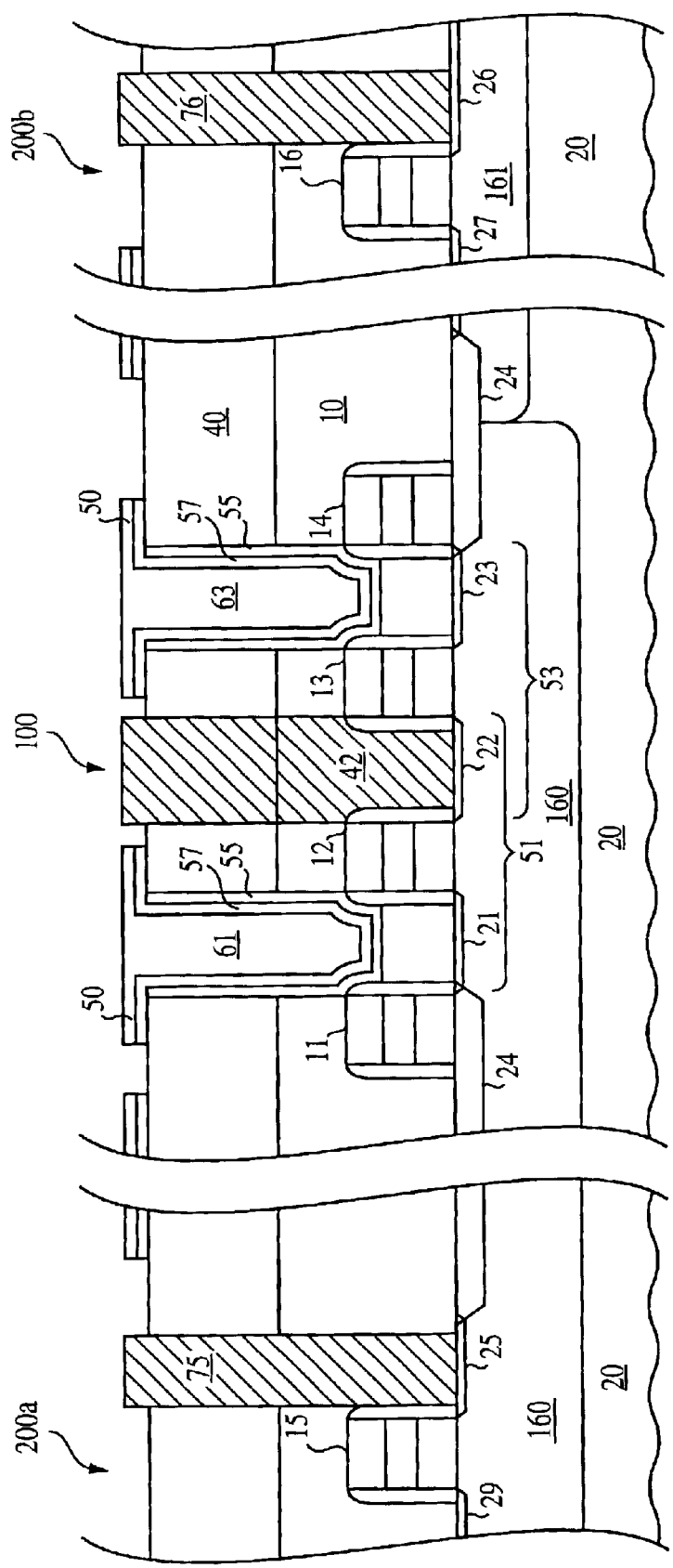
FIG. 8 shows the semiconductor device of FIG. 1 at a processing step subsequent to that shown in FIG. 7.

Referring to FIG. 8 the resulting structure is planarized by, for example, CMP. The metal layer 70 and the upper capacitor plate 50 may, for example, be planarized to remove the metal layer 70 and level upper capacitor plate 50 down to at least a thickness of about 500 Angstroms after CMP. In addition, the dielectric layer 57 and upper cell plate 50 are etched back away from the conductive plugs 72, 75, 76.

Figure 9:
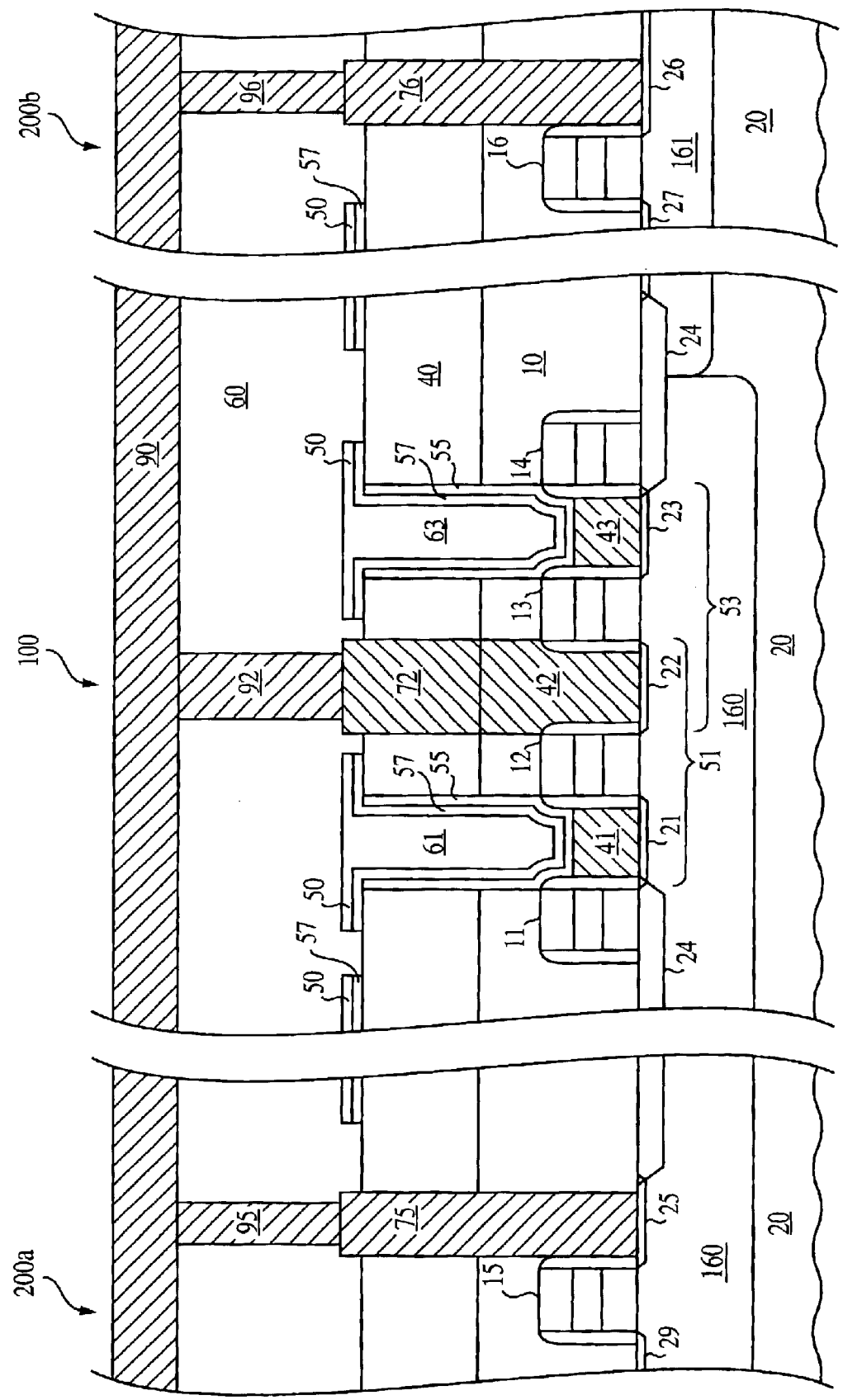
FIG. 9 shows the semiconductor device of FIG. 1 at a processing step subsequent to that shown in FIG. 8.

As shown in FIG. 9, a third insulating layer 60, e.g. BPSG layer 60, is deposited over the upper capacitor plate 50. A photoresist layer is then applied and patterned to form etching openings over the metal plugs 72, 75, 76 and a directional etching or other suitable etch process is next performed to etch through the third BPSG layer 60 to expose contact areas of the metal plugs 72, 75, 76. The etchant conditions are such that only the insulated layer 60 is etched without any or minimal etching of the metal plugs 72, 75, 76. The exposed contact areas of the metal plugs 75, 76 in the peripheral areas 200a, 200b are preferably of a smaller surface area than the diameter of the metal plugs 75, 76.

Figure 15:
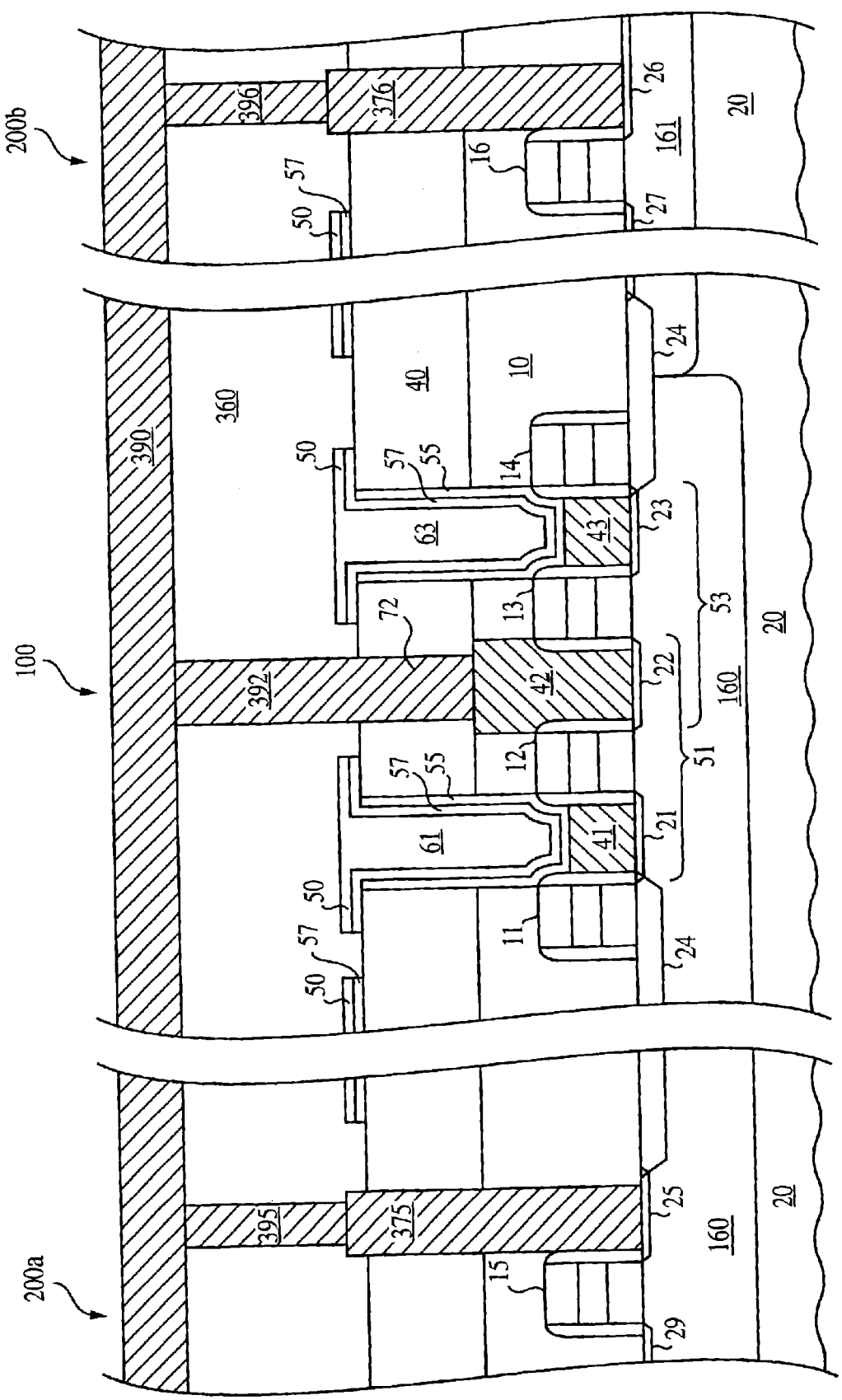
FIG. 15 shows the semiconductor device of FIG. 1 at a processing step subsequent to that shown in FIG. 14.

As further shown in FIG. 9, once the photoresist layer (not shown) is removed, a conductive layer 90 formed from a suitable conductive material such as tungsten or other metal, is deposited over the third BPSG layer 60 to form the contacts 92, 95, 96. The contacts 92, 95, 96 may be of any suitable size and shape so as to provide a low resistance vertical and lateral path to the active areas 22, 25, 26. The contacts 95, 96 in the peripheral areas are preferably of a smaller area than the peripheral metal plugs 75, 76. The peripheral contacts 95, 96 are preferably round in top down cross-sectional shape as shown in FIG. 15, even though the metal plugs 75, 76 have an oval top down cross-sectional shape.

Figure 10:
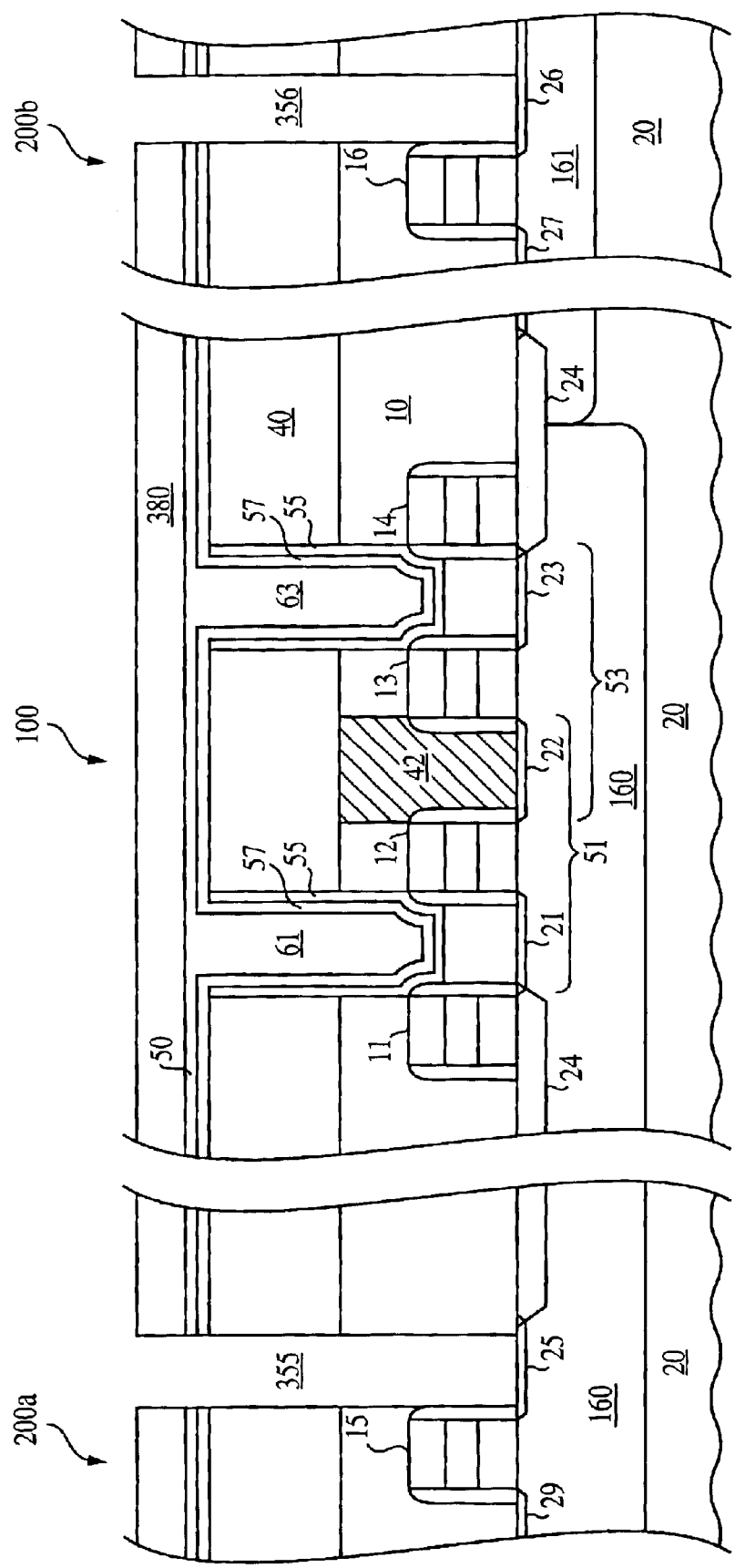
FIG. 10 shows the semiconductor device of FIG. 1 at a processing step subsequent to that shown in FIG. 5 according to an alternate embodiment of the present invention.

An alternate embodiment is described with reference to FIGS. 10–15. Like numerals from the first described embodiment are utilized where appropriate, with differences being indicated by 300 series numerals or with different numerals. FIG. 10, shows a processing step conducted subsequent to the processing steps shown in FIG. 5. As shown in FIG. 10, a directional etching process or other suitable process occurs in the peripheral circuitry area 200 to etch through a photoresist mask 380 and the BPSG layers 10, 40 thus forming peripheral plug openings 355, 356 and exposing active areas 25, 26 for the N-channel and P-channel transistors in the peripheral areas 200a, 200b. The photoresist mask layer 380 is removed after the etching process. Unlike the processing step shown in FIG. 6, the bit line is not etched at this time.

Figure 11:
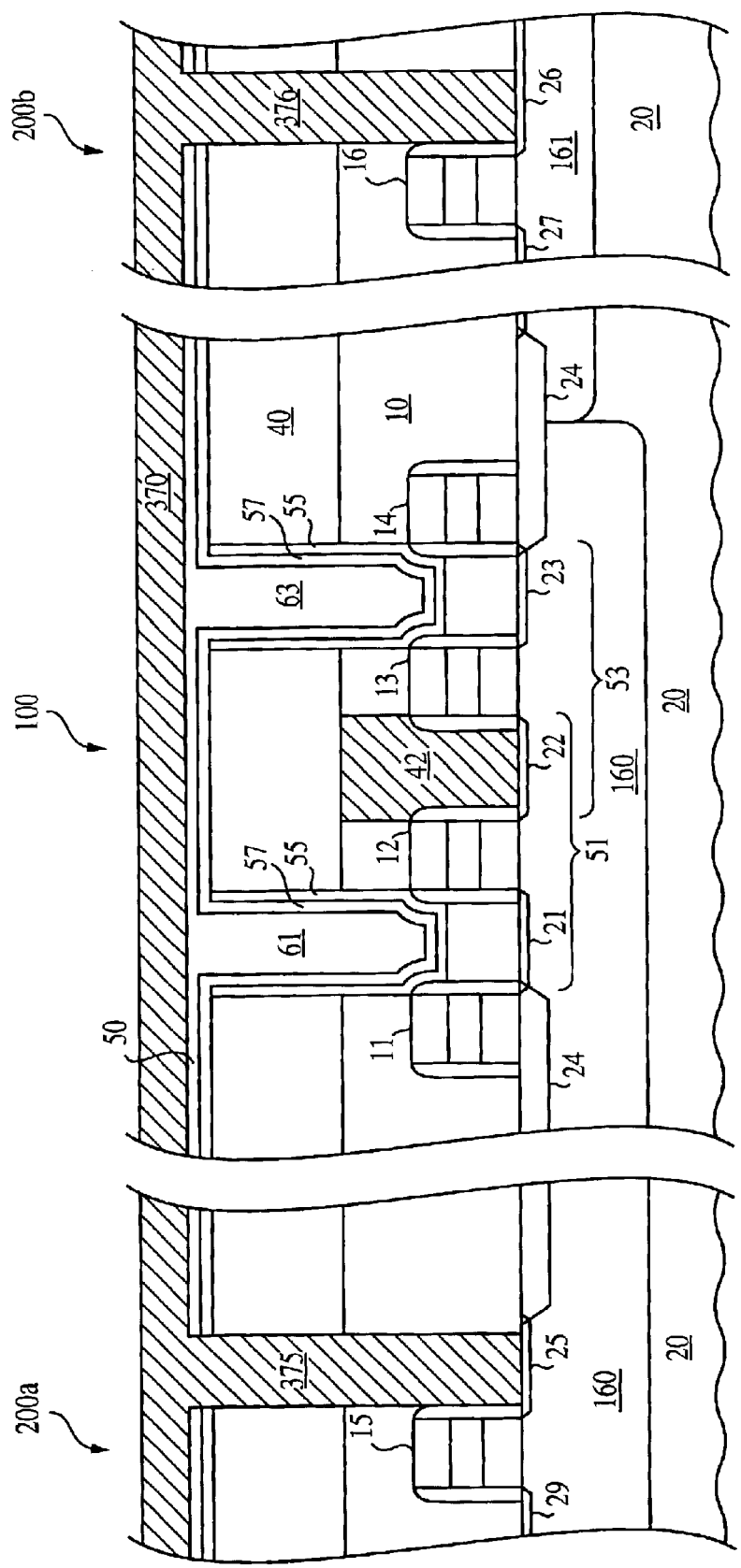
FIG. 11 shows the semiconductor device of FIG. 1 at a processing step subsequent to that shown in FIG. 10 according to an alternate embodiment of the present invention.

Referring to FIG. 11, a metal layer 370 is deposited over the memory array 100, and the peripheral circuitry area 200. Accordingly, the metal layer is formed over the exposed outer surfaces of active areas 25, 26, which are P+ doped for the P-channel transistors or N+ doped for the N-channel transistors, to form metal peripheral plugs 375, 376. Preferably, the metal layer 370 comprises titanium, titanium nitride, tungsten, cobalt, molybdenum or tantalum, but any suitable metal may be used.

Figure 12:
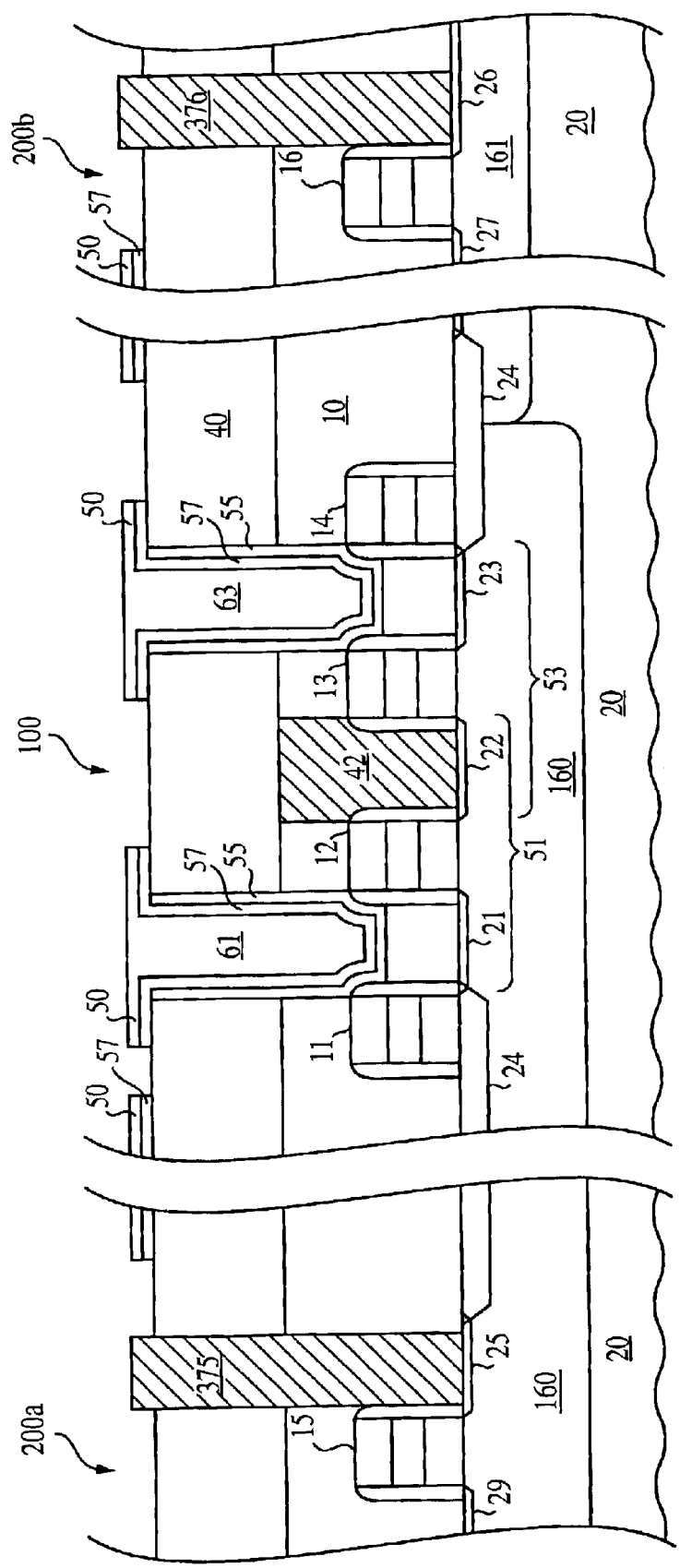
FIG. 12 shows the semiconductor device of FIG. 1 at a processing step subsequent to that shown in FIG. 11 according to an alternate embodiment of the present invention.

As shown in FIG. 12, the metal layer is planarized by, for example CMP. The metal layer 370 may for example be planarized to remove the metal layer 370 and level the upper capacitor plate 50 down to at least a thickness of about 500 Angstroms after CMP. In addition, the dielectric layer 57 and upper cell plate 50 are etched back away from the conductive plugs 375 and 376.

Figure 13:
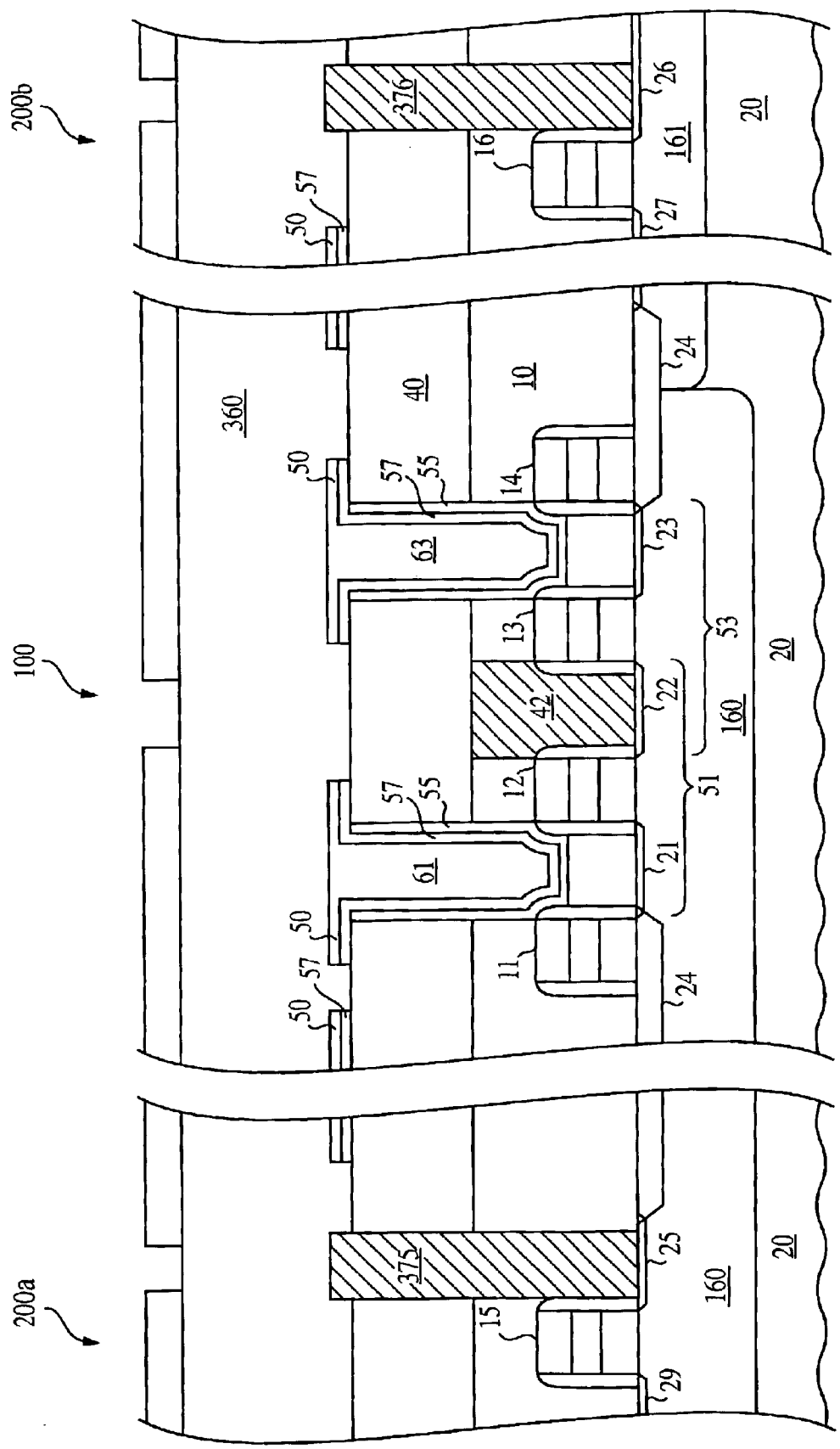
FIG. 13 shows the semiconductor device of FIG. 1 at a processing step subsequent to that shown in FIG. 12 according to an alternate embodiment of the present invention.

As shown in FIG. 13, a third insulating layer 360, e.g. BPSG layer 360, has been deposited over the substrate to fill openings around the capacitors 61, 63. A photoresist layer 318 is then applied over the third insulating layer and patterned to form etching openings over the bit line poly plug 42 and the metal peripheral plugs 375, 376.

Figure 14:
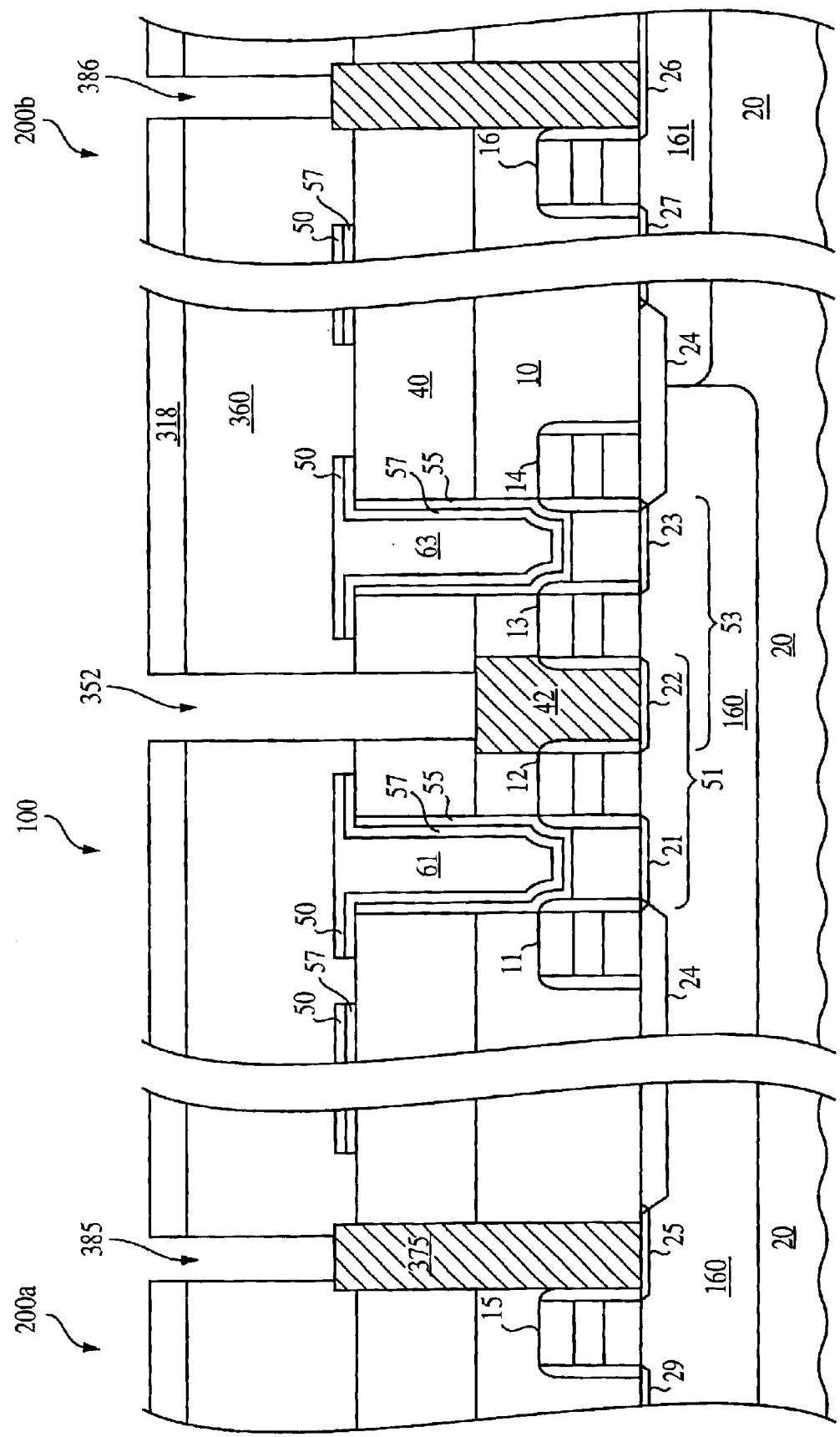
FIG. 14 shows the semiconductor device of FIG. 1 at a processing step subsequent to that shown in FIG. 13 according to an alternate embodiment of the present invention.

As shown in FIG. 14, a directional etching or other suitable etch process is performed to etch through the third BPSG layer 360 to form metal plug contact openings 385, 386 and to etch through the second and third BPSG layers 40, 360 to form the bit line opening 352 so as to expose contact areas of the metal plugs 375, 376 and the bit line poly plug 42. The etchant conditions are such that only the insulated layer 360 is etched without any or minimal etching of the metal plugs 375, 376 and the poly plug 42. The metal plug contact openings 385, 386 are preferably of a smaller diameter than the metal plugs 375, 376.

As shown in FIG. 15, a conductive layer 90 formed from a suitable conductive material such as tungsten or other metal, is next deposited over the third BPSG layer 360 to fill the metal plug contact openings 385, 386 and the bit line opening 352 so as to form contacts 392, 395, 396. The contacts may be of any suitable size and shape so as to provide a low resistance vertical and lateral path to the active areas 22, 25, 26. The contacts 395, 396 in the periphery are preferably of a smaller cross-sectional top view area than the peripheral metal plugs 375, 376. The peripheral contacts 395, 396 preferably have a round top view cross-sectional shape as shown in FIG. 16, even though the metal plugs 375, 376 may have an oval top view cross-sectional shape.

In accordance with the present invention the metal periphery plugs are formed after the formation of the capacitors. Preferably the process of forming the metal periphery plugs begins after the completion of all high temperature processing steps utilized in wafer fabrication and after any other temperature changes that affect metal plug formation. Preferably, the process begins after the heat cycles used for cell poly activation and capacitor formation. The metal plugs may be formed prior to forming upper cell plate contacts to the capacitor of the memory device but subsequent to high temperature processing treatment for the capacitor. Furthermore, the present invention is not limited to the illustrated layers. Any suitable number and/or arrangement of conductive and insulating layers may be used without departing from the spirit of the invention.

Figure 16:
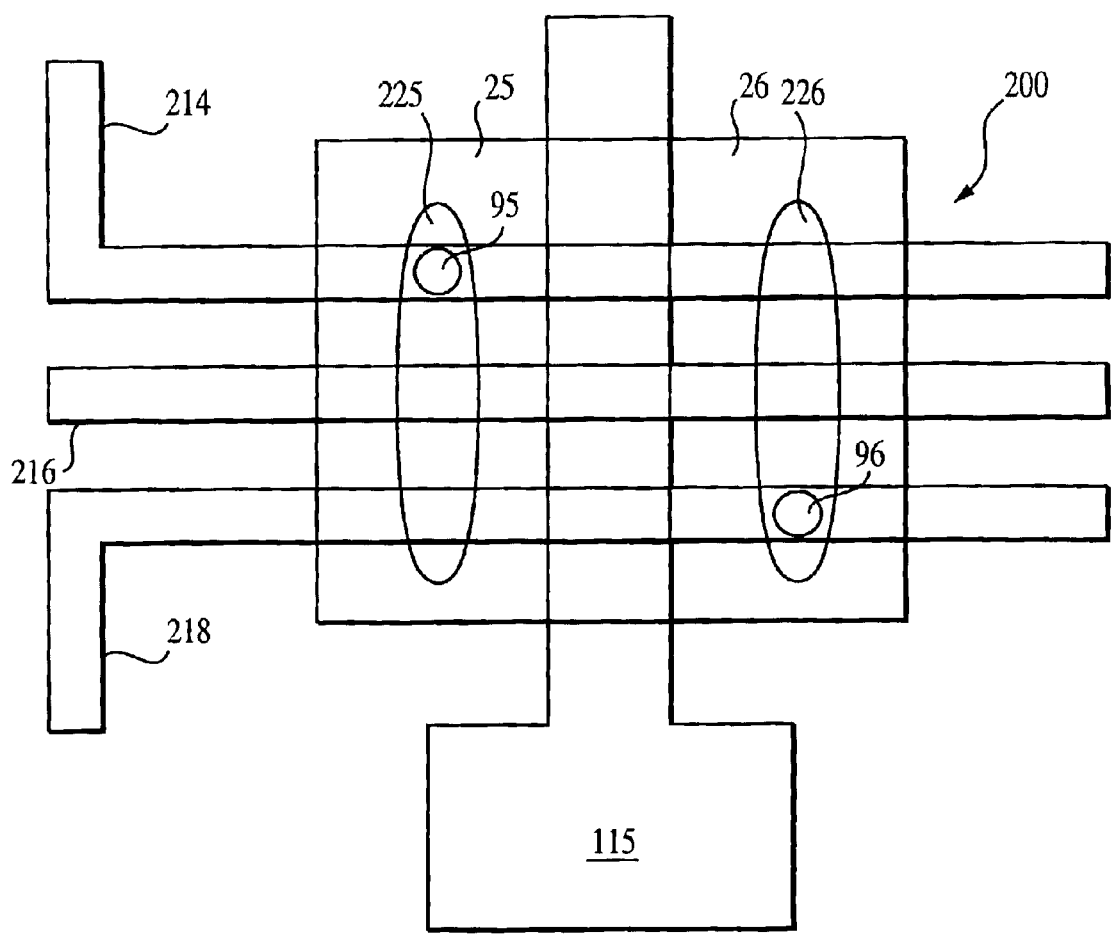
FIG. 16 is a top down view of a peripheral logic circuitry area of a memory array according to the present invention.

FIG. 16 shows a general top down cross-sectional view of a peripheral logic circuitry area of a memory array according to the present invention. The metals plugs in the peripheral circuitry area 200 are shown as oval metal plugs 225, 226, which provide conductivity down to P+ or N+ doped active areas 25, 26 respectively. Three conductive routing channels 214, 216, 218 are shown extending generally lengthwise. Typically, one or more insulating layers overlay and separate the routing channels 214, 216, 218. Beneath, the BPSG layers, other conductive routing channels are formed extending generally widthwise. As shown, the metal contact 96 provides for an electrical connection to be made between the routing channel 218 and the active area 26. A metal contact 95 provides for an electrical connection to be made between the routing channel 214 and the active area 25.

One of the advantages of the present invention is the use of metal plugs down to the active areas of the substrate. This provides reduced resistance in making connections between routing channels and the active areas. Accordingly, by providing metal plugs down to the active areas of the substrate in accordance with the present invention electrical connections can be made without bridging, which allows for tighter pitched electrical connections. In addition, by providing oval shaped metal plugs electrical connections can be made to multiple routing channels, as needed.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A memory device comprising:
    a memory array area and a peripheral circuitry area, said memory array area comprising at least one access transistor of a first conductivity type and at least one capacitor for storing a data value which is associated with said access transistor, said peripheral circuitry area comprising at least one peripheral transistor of a first conductivity type and at least one peripheral transistor of a second conductivity type, and at least one first metal plug having a first end contacting an active area of said peripheral transistor of said first conductivity type and a second end electrically connected to a metal layer and at least one second metal plug having a first end contacting an active area of said peripheral transistor of said second conductivity type and a second end electrically connected to said metal layer, wherein a top cell plate of said capacitor is on a same horizontal plane as said second ends of said first and second metal plugs.

2. The memory device of claim 1 wherein said first and second metal plugs have an oval top down cross-sectional shape.

3. The memory device of claim 2 wherein said first conductivity type is N+.

4. The memory device of claim 2, wherein said second conductivity type is P+.

5. A memory device comprising:
    a pair of spaced word lines;
    source and drain regions on opposite sides of said word lines to define a plurality of memory cell access transistors within a memory cell array area;
    a pair of access transistors sharing a source/drain region;
    at least one first insulating layer formed over said access transistors;
    a pair of capacitor polysilicon plugs and a bit line polysilicon plug formed through said first insulating layer to said source and drain regions of said access transistor;
    at least one second insulating layer formed over said polysilicon plugs;
    container capacitors, respectively associated with one of said access transistors in said second insulating layer over and in electrical communication with respective capacitor polysilicon plugs;
    N-channel and P-channel peripheral logic transistors outside said memory cell array area wherein said N-channel and P-channel peripheral logic transistors comprise first metal plugs to contact said N-channel peripheral logic transistor and second metal plugs to contact said P-channel peripheral logic transistor, said first metal plugs and said second metal plugs being formed through said first and second insulating layers,
    a first bit line contact formed through said second insulating layer to said bit line polysilicon plug;
    at least one third insulating layer over said container capacitors; and
    metal contacts formed through said third insulating layer to said first metal plugs, said second metal plugs, and said first bit line contact.

6. The device of claim 5 wherein said first and second metal plugs have an oval top down cross-sectional shape.

7. The device of claim 6 wherein said metal contacts have a round top down cross-sectional shape.

8. The device of claim 5 wherein said metal contacts have a smaller diameter than said first and second metal plugs.

9. The device of claim 8 wherein said first metal plugs and said bit line plugs are in an N-channel transistor area.

10. The device of claim 5, wherein said bit line contact and said respective metal contact formed through said insulating layer are a unitary structure.

11. A memory device comprising:
    a memory array area comprising transistors of a first conductivity type, wherein said memory array first conductivity type transistors are each associated with a memory array first conductivity type active area;
    a peripheral array area comprising transistors of said first conductivity type, wherein said peripheral array first conductivity type transistors are associated with a peripheral array first conductivity type active area, and further comprising transistors of a second conductivity type, wherein said second conductivity type transistors are associated with a second conductivity type active area;
    a first insulating layer formed over said memory array area and said peripheral array area;
    a pair of capacitor plugs and a bit line plug formed through said first insulating layer to contact said memory array first conductivity type active area;
    a second insulating layer formed over said first insulating layer, said capacitor plugs and said bit line plug;
    capacitor containers formed in at least said second insulating layer and in contact with said capacitor plugs;
    a third insulating layer formed over said second insulating layer and said capacitor containers;
    a metal plug formed through said second insulating layer to contact said bit line plug; and
    metal plugs in said peripheral array area formed through said first and second insulating layers to contact respective active areas of said peripheral array first conductivity type and said second conductivity type.

12. A memory device comprising:
    a memory array area comprising transistors of a first conductivity type, wherein said memory array first conductivity type transistors are each associated with a memory array first conductivity type active area;
    a peripheral array area comprising transistors of said first conductivity type, wherein said peripheral array first conductivity type transistors are associated with a peripheral array first conductivity type active area, and further comprising transistors of a second conductivity type, wherein said second conductivity type transistors are associated with a second conductivity type active area;

a first insulating layer formed over said memory array area and said peripheral array area;

a pair of capacitor plugs and a bit line plug formed through said first insulating layer to contact said memory array first conductivity type active area;

a second insulating layer formed over said first insulating layer, said capacitor plugs, and said bit line plug;

capacitor containers comprising a bottom plate, a dielectric layer and an upper capacitor plate formed in at least said second insulating layer;

metal plugs in said peripheral array area formed through said first and second insulating layer to contact respective active areas of said peripheral array first conductivity type and said second conductivity type;

a third insulating layer formed over said capacitor containers, said metal plugs, and said second insulating layer;

a metal bit line contact formed through said second and third insulating layer to contact said bit line plug; and metal contacts formed through said third insulating layer to contact said metal plugs in said peripheral array area.

13. The device of claim 12 wherein said metal plugs have an oval top down cross-sectional shape.

14. The device of claim 13 wherein said metal contacts have a round top down cross-sectional shape.

15. The device of claim 12 wherein said metal contacts have a smaller diameter than said first and second metal plugs.

16. The device of claim 15 wherein said first conductivity type is N+.

17. The memory device of claim 1, wherein said active areas have approximately no portion of said first and second metal plugs diffused therein.

18. A memory device comprising:

a memory array and a peripheral circuitry area, said memory array area comprising at least one access transistor of a first conductivity type, at least one capacitor for storing a data value that is associated with said access transistor, at least one polysilicon plug electrically connected to an active area of the at least one access transistor, at least one first metal plug electrically connecting said at least one polysilicon plug to a metal layer over said memory array area, said peripheral circuitry area comprising at least one peripheral transistor of a first or second conductivity type, at least one second metal plug electrically connected to an active area of said peripheral transistor of said first or second conductivity type, and metal contacts electrically connected to said first and second metal plugs, wherein said metal contacts have a smaller diameter than said first and second metal plugs.

19. The memory device of claim 18, wherein said first and second metal plugs have an oval top down cross-sectional shape.

20. The memory device of claim 18, wherein said first conductivity type is n-type.

21. The memory device of claim 18, wherein said active areas have approximately no portion of said first and second metal plugs diffused therein.

* * * * *